United States Patent
Eckel et al.

(10) Patent No.: US 11,211,923 B2
(45) Date of Patent: Dec. 28, 2021

(54) OPERATING A BIPOLAR TRANSISTOR HAVING AN INSULATED GATE ELECTRODE

(71) Applicant: Siemens Aktiengesellschaft, Munich (DE)

(72) Inventors: Hans-Günther Eckel, Rostock (DE); Jan Fuhrmann, Rostock (DE); Felix Kayser, Rostock (DE); Quang Tien Tran, Rostock (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 0 days.

(21) Appl. No.: 17/272,118

(22) PCT Filed: Aug. 20, 2019

(86) PCT No.: PCT/EP2019/072200
§ 371 (c)(1),
(2) Date: Feb. 26, 2021

(87) PCT Pub. No.: WO2020/043540
PCT Pub. Date: Mar. 5, 2020

(65) Prior Publication Data
US 2021/0313978 A1  Oct. 7, 2021

(30) Foreign Application Priority Data
Aug. 28, 2018 (EP) ..................................... 18191128

(51) Int. Cl.
*H03K 17/56* (2006.01)
*H03K 17/0812* (2006.01)

(52) U.S. Cl.
CPC .............................. *H03K 17/08128* (2013.01)

(58) Field of Classification Search
CPC .......................... H03K 17/08128; H03K 17/56
(Continued)

(56) References Cited

U.S. PATENT DOCUMENTS

| 8,138,818 B2* | 3/2012 | Tsunoda | ........... H03K 17/08128 |
| | | | 327/374 |
| 2005/0206438 A1* | 9/2005 | Higashi | ................ H03K 17/166 |
| | | | 327/427 |

(Continued)

FOREIGN PATENT DOCUMENTS

| DE | 10 2013 223 135 B3 | 11/2014 |
| JP | 2002 153043 A | 5/2002 |

OTHER PUBLICATIONS

PCT International Search Report and Written Opinion of International Searching Authority dated Nov. 15, 2019 corresponding to PCT International Application No. PCT/EP2019/072200 filed Aug. 20, 2019.

*Primary Examiner* — Ryan Jager
(74) *Attorney, Agent, or Firm* — Henry M. Feiereisen LLC (57) ABSTRACT

A method for operating an IGBT includes determining a maximum stationary reverse bias required for operation of the IGBT, determining a first removal charge, the removal of which at the gate of the IGBT causes an electric field strength that enables the IGBT to accept the maximum stationary reverse bias during stationary blocking, determining a second removal charge, the removal of which at the gate causes an electric field strength that leads to a dynamic avalanche, and, when the IGBT is switched off, removing from the gate during a charge removal duration a removal charge that is greater than the first removal charge and smaller than the second removal charge.

8 Claims, 7 Drawing Sheets

(58) Field of Classification Search
USPC .......................................................... 327/419
See application file for complete search history.

(56) References Cited

U.S. PATENT DOCUMENTS

| | | | |
|---|---|---|---|
| 2012/0025897 A1* | 2/2012 | Wasekura | H03K 17/168 327/518 |
| 2014/0043089 A1* | 2/2014 | Schiller | H03K 17/04206 327/376 |
| 2014/0062541 A1* | 3/2014 | Wasekura | H02M 1/08 327/109 |
| 2016/0329883 A1* | 11/2016 | Kirchner | H03K 17/168 |
| 2017/0302151 A1* | 10/2017 | Snook | H03K 17/063 |
| 2019/0044446 A1* | 2/2019 | Fuhrmann | H03K 17/162 |

* cited by examiner

OPERATING A BIPOLAR TRANSISTOR HAVING AN INSULATED GATE ELECTRODE

CROSS-REFERENCES TO RELATED APPLICATIONS

This application is the U.S. National Stage of International Application No. PCT/EP2019/072200, filed Aug. 20, 2019, which designated the United States and has been published as International Publication No. WO 2020/043540 and which claims the priority of European Patent Application, Serial No. 18191128.0, filed Aug. 28, 2018, pursuant to 35 U.S.C. 119(a)-(d).

BACKGROUND OF THE INVENTION

The invention relates to a method and a gate driver for operating a bipolar transistor having an insulated-gate bipolar transistor (IGBT).

When an IGBT is switched off, high electric field strengths occur in the IGBT, which can lead to dynamic avalanche. This can lead to spontaneous failure or to long-term degeneration of the IGBT. This problem is particularly pronounced for high reverse voltages in the range of 3.3 kV and above. In the known prior art, the problem is solved, for example, in that the switching speed of the IGBT is reduced. The reduction of the switching speed reduces the field strength charge of the IGBT and can therefore prevent dynamic avalanche. However, a reduction in the switching speed increases the switch-off losses when the IGBT is switched off.

DE 10 2013 223 135 B3 discloses a circuit arrangement and a method for controlling an IGBT with a drive signal for charging or discharging the gate of the IGBT and a trigger signal. The trigger signal signals a first point in time which, during a switch-off process of the IGBT, is in the region of the increase of the collector-emitter voltage of the IGBT. With the drive signal, the gate is recharged for a defined period of time at or after the first point in time in order to avoid transient avalanche oscillations.

JP 2002 153043 A discloses a converter arrangement having a power semiconductor switch, in which a switch is made in a current range with transistors to a gate resistor for extending the switch-off operating time in order to suppress a transient avalanche phenomenon.

The object of the invention is to prevent dynamic avalanche when an IGBT is switched off without reducing the switching speed of the IGBT during normal operation.

SUMMARY OF THE INVENTION

The object is achieved according to the invention by a method as set forth hereinafter and by a gate driver as set forth hereinafter.

The dependent claims relate to advantageous embodiments of the invention.

In the method according to the invention for operating an IGBT, a maximum steady-state reverse voltage required for operation of the IGBT, a first removal charge, the removal of which at the gate of the IGBT brings about an electric field strength which enables the IGBT to accept the maximum steady-state reverse voltage during steady-state blocking, and a second removal charge, the removal of which at the gate brings about an electric field strength which leads to a dynamic avalanche, are first determined. When the IGBT is switched off, a removal charge greater than the first removal charge and less than the second removal charge is taken from the gate during a charge removal period. Hereinafter, the first removal charge is therefore also referred to as a minimum removal charge and the second removal charge is also referred to as a maximum removal charge. The first removal charge and the second removal charge are determined and specified, for example, on the basis of known properties of the IGBT which are taken, for example, at least partially from a data sheet of the IGBT, and/or experimentally by means of tests.

The invention therefore provides for controlling an amount of charge taken from the gate of the IGBT to prevent dynamic avalanche when the IGBT is switched off. The invention makes use of the fact that the electric field strengths occurring in the IGBT depend on the charge which is taken from the gate of the IGBT when it is switched off. The idea on which the invention is based is to limit the amount of charge taken from the gate when switching off to prevent dynamic avalanche. To this end, a minimum removal charge, the removal of which at the gate enables a maximum steady-state reverse voltage to be accepted by the IGBT, and a maximum removal charge, the removal of which at the gate leads to a dynamic avalanche, are determined and when the IGBT is switched off, a removal charge which is between the minimum and the maximum removal charge is taken from the gate. As a result, dynamic avalanche is prevented when the IGBT is switched off without having to reduce the switching speed of the IGBT in rated operation and thereby to increase the switch-off losses when the IGBT is switched off in rated operation.

The removal charge is removed by applying a switch-off voltage between the gate and the emitter during the charge removal period. Furthermore, during the application of the switch-off voltage, a gate current flowing in the gate is measured, a charge taken from the gate is determined from the gate current, and an end of the charge removal period is defined in that the charge taken from the gate reaches the removal charge. The invention therefore provides for the charge removed from the gate when the IGBT is switched off to be controlled by the application of a gate-emitter voltage during the charge removal period. Measuring the charge removed from the gate enables this charge to be limited to the removal charge, especially if the gate current in the gate is not constant during the charge removal period.

In one embodiment of the invention, the removal charge is removed by generating a constant gate current flowing in the gate during the charge removal period. This embodiment of the invention enables the definition of the charge removal period as the quotient of the removal charge and the constant gate current. If the gate current is known, measurement of the gate current is not required for this purpose.

In a further embodiment of the invention, a threshold value is specified for the gate-emitter voltage of the IGBT and the removal of charge from the gate is terminated when the gate-emitter voltage reaches the threshold value. This embodiment of the invention prevents the gate-emitter voltage from becoming too low and leading to damage to the IGBT when the IGBT is switched off.

In the method according to the invention for operating two IGBT connected to form a half bridge, each IGBT is operated using the method according to the invention described above or one of its embodiments. The two IGBT are switched on alternately for one switch-on period each, wherein in each case two consecutive switch-on periods are separated from one another by a locking period in which both IGBTs are switched off. The charge removal period for each IGBT is divided into two charge removal periods separated from one another by a removal pause, wherein a first charge removal period begins with the switching off of the IGBT and ends before the switching on of the other IGBT and the second charge removal period begins after the end of the first charge removal period and before the switching on of the other IGBT and ends with the switching on of the IGBT.

The aforementioned method takes into account that, depending on the ratio between the Miller capacitance and the gate emitter capacitance in an IGBT and the negative driving voltage of the control circuit when using the method according to the invention when switching off the IGBT, the gate-emitter voltage may have already reached the negative driving voltage before the intended removal charge could be removed from the gate. When the other IGBT is switched on, the switched-off IGBT then accepts voltage. As a result of the Miller capacitance, a parasitic switching-on of the switched-off IGBT, which is triggered at high impedance, can then occur. In the aforementioned method, this is avoided in that the charge removal from the gate is terminated and after the termination, is resumed before the expiry of the locking time, but after the expiry of a regular switch-off process, and in this way the gate is kept at a low potential below the threshold voltage of the IGBT.

In the aforementioned method according to the invention and its embodiments, the charge removal period is, for example, between one hundred nanoseconds and ten microseconds. As a rule, such a charge removal period enables a charge to be removed from the gate of an IGBT which is between the minimum and the maximum removal charge.

A gate driver according to the invention for an IGBT for carrying out the method according to the invention is designed to alternately switch on the IGBT for a switch-on period and to switch off the IGBT for a switch-off period and to remove the gate of the IGBT in each switch-off period.

The gate driver comprises a controllable switch-off semiconductor switch which can be switched on to apply a switch-off voltage between the gate and the emitter of the IGBT, a switch-off resistor connected between the switch-off semiconductor switch and the gate or connected downstream of the gate emitter path of the IGBT and a control logic which is designed to switch on the switch-off semiconductor switch for the charge removal period. The gate driver further comprises a current measuring apparatus for measuring a gate current flowing in the gate, wherein the control logic is designed to determine a charge taken from the gate from the gate current and to define an end of the charge removal period in that the charge taken from the gate reaches the removal charge. In addition, the gate driver can have a series circuit connected in parallel to the switch-off semiconductor switch and the switch-off resistor of an additional switch-off semiconductor switch and an additional switch-off resistor, wherein the additional switch-off resistor is greater than the switch-off resistor and the additional switch-off semiconductor switch can be switched on to apply an additional switch-off voltage between the gate and the emitter.

A gate driver according to the invention makes it possible to remove the charge from the gate of an IGBT by means of a switch-off semiconductor switch and switch-off resistor and a control logic for controlling the switch-off semiconductor switch in order for the switch-off semiconductor switch to be switched on for the removal of charge from the gate and to be switched off to end the removal of the charge. A current measuring apparatus measuring the gate current makes it possible to determine the charge taken from the gate by integrating the gate current over time and thus limiting the removal of the charge to the intended removal charge by terminating the removal of the charge when the removal charge is reached. The switch-off behavior of the IGBT can be advantageously stabilized by means of a series circuit connected in parallel with the switch-off semiconductor switch and the switch-off resistor of an additional switch-off semiconductor switch and an additional switch-off resistor which is greater than the switch-off resistor in that the additional switch-off semiconductor switch is switched on during the switch-off period of the IGBT. Selecting a sufficiently large additional switch-off resistor makes it possible for only a little additional charge to be taken from the gate of the IGBT by switching on the additional switch-off semiconductor switch, so that the removal charge is predominantly taken from the gate by switching on the switch-off semiconductor switch.

An embodiment of the gate driver according to the invention provides a controllable switch-off current source which can be switched on to generate a constant gate current in the gate, and a control logic which is designed to switch on the switch-off current source for the charge removal period. This embodiment of the gate driver according to the invention enables the charge removal period to be defined by the quotient of the removal charge and the constant gate current, so that in the case of a known constant gate current, in particular, no current measuring apparatus is required for measuring the gate current.

BRIEF DESCRIPTION OF THE DRAWING

The properties, features and advantages of this invention described above and the manner in which these are achieved will become clearer and more explicitly understood in connection with the following description of exemplary $ embodiments which are explained in more detail in connection with the diagrams. The diagrams show.

Parts corresponding to one another are provided with the same reference characters in the figures.

DETAILED DESCRIPTION OF PREFERRED EMBODIMENTS

Figure 1:
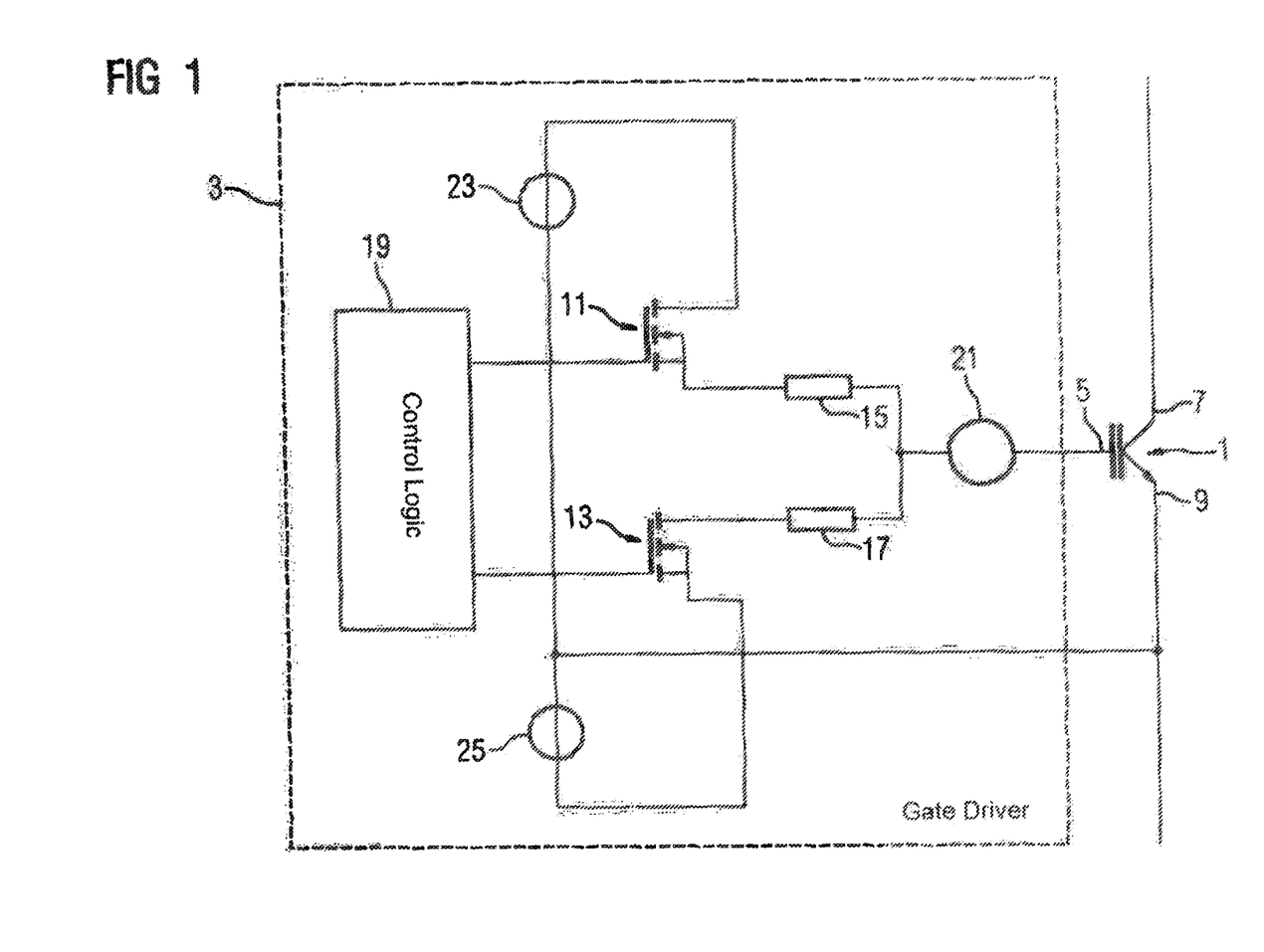
FIG. 1 A circuit diagram of an IGBT and a first exemplary embodiment of a gate driver for an IGBT, FIG. 2 Chronological sequences of switching states of the IGBT and the gate driver shown in FIG. 1, FIG. 3 A circuit diagram of an IGBT and a second exemplary embodiment of a gate driver for an IGBT, FIG. 4 Chronological sequences of switching states of the IGBT and the gate driver shown in FIG. 3, FIG. 5 A circuit diagram of an IGBT and a third exemplary embodiment of a gate driver for an IGBT, FIG. 6 A circuit diagram of a half-bridge circuit with two IGBT and a gate driver for each IGBT, FIG. 7 Chronological sequences of switching states of the IGBT and gate driver shown in FIG. 6.

FIG. 1 shows a circuit diagram of an IGBT 1 and a first exemplary embodiment of a gate driver 3 for an IGBT 1.

The IGBT 1 has a gate 5, a collector 7 and an emitter 9.

The gate driver 3 has a switch-on semiconductor switch 11, a switch-off semiconductor switch 13, a switch-on resistor 15, a switch-off resistor 17, a control logic 19, an optional current measuring apparatus 21, a switch-on voltage source 23 and a switch-off voltage source 25.

The switch-on semiconductor switch 11 is connected to the gate 5 of the IGBT 1 via the switch-on resistor 15. The switch-off semiconductor switch 13 is connected to the gate 5 of the IGBT 1 via the switch-off resistor 17. The switch-on semiconductor switch 11 and the switch-off semiconductor switch 13 can be controlled by the control logic 19. The switch-on semiconductor switch 11, the switch-on resistor 15, the switch-off semiconductor switch 13 and the switch-off resistor 17 are connected to a half bridge with a bridge branch which is connected to the gate 5 of the IGBT 1, a first bridge arm in which the switch-on semiconductor switch 11 and the switch-on resistor 15 are arranged, and a second bridge arm in which the switch-off semiconductor switch 13 and the switch-off resistor 17 are arranged. The current measuring apparatus 21 is arranged in the bridge branch of the half bridge.

The switch-on voltage source 23 generates a switch-on supply voltage for the switch-on semiconductor switch 11. The switch-off voltage source 25 generates a switch-off supply voltage for the switch-off semiconductor switch 13.

In the exemplary embodiment shown in FIG. 1, the switch-on semiconductor switch 11 and the switch-off semiconductor switch 13 are each designed as a metal-oxide-semiconductor field-effect transistor (MOSFET), more precisely as a normal blocking n-channel MOSFET, the gate terminal of which is connected to the control logic 19. The source terminal of the switch-on semiconductor switch 11 is connected to the switch-on resistor 15. The drain terminal of the switch-off semiconductor switch 13 is connected to the switch-off resistor 17. A first pole of the switch-on voltage source 23 is connected to the drain terminal of the switch-on semiconductor switch 11. A first pole of the switch-off voltage source 25 is connected to the source terminal of the switch-off semiconductor switch 13. The second pole of the switch-on voltage source 23 and the second pole of the switch-off voltage source 25 are connected to one another and to the emitter 9 of the IGBT 1. The second poles of the switch-on voltage source 23 and the switch-off voltage source 25 therefore have a common first electrical potential. The first pole of the switch-on voltage source 23 has a second electrical potential which is higher than the first electrical potential. The first pole of the switch-off voltage source 25 has a third electrical potential which is lower than the first electrical potential. The switch-on supply voltage is therefore positive, the switch-off supply voltage is negative.

Figure 2:
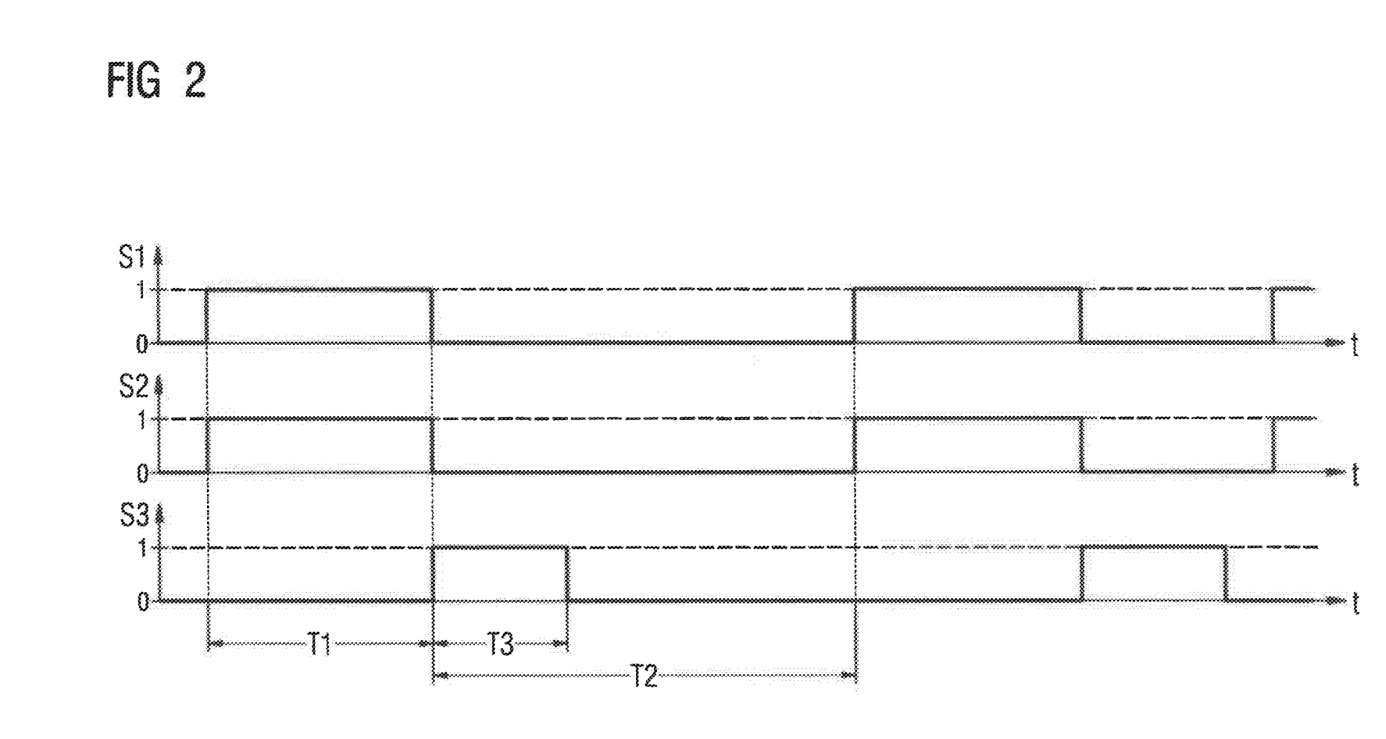

FIG. 2 illustrates the method according to the invention for operating an IGBT 1 with a gate driver 3 shown in FIG. 1 on the basis of sequences of a switching state S1 of the IGBT 1, a switching state S2 of the switch-on semiconductor switch 11 and a switching state S3 of the switch-off semiconductor switch 13 as a function of a time t. Each switching state S1, S2, S3 alternately assumes the value one, which denotes a switched-on state, and the value zero, which denotes a switched-off state.

In the method, a maximum steady-state reverse voltage required for operation of the IGBT 1, a minimum removal charge, the removal of which at gate 5 of the IGBT 1 leads to an electric field strength which enables the IGBT 1 to accept the maximum steady-state reverse voltage during steady-state blocking, and a maximum removal charge, the removal of which at gate 5 leads to an electric field strength which leads to a dynamic avalanche, are determined.

The IGBT 1 is alternately switched on for a switch-on period T1 and switched off for a switch-off period T2. During each switch-on period T1, the switch-on semiconductor switch 11 is switched on and the switch-off semiconductor switch 13 is switched off. During each switch-off period T2, the switch-on semiconductor switch 11 is switched off and the switch-off semiconductor switch 13 is initially switched on for a charge removal period T3 and switched off after the expiry of the charge removal period T3. The charge removal period T3 is defined by the fact that a previously determined removal charge greater than the minimum removal charge and less than the maximum removal charge is taken from the gate 5 of the IGBT 1 during the charge removal period T3, in other words, the switch-off semiconductor switch 13 is switched off as soon as the charge taken from the gate 5 reaches the removal charge. For this purpose, for example, a gate current flowing in the gate is constantly detected with the current measuring apparatus 21 and the charge taken from the gate is determined from the detected gate current by means of the control logic 19 in that the gate current is integrated over time after the switch-off semiconductor switch 13 has been switched on. Alternatively, a switch-off voltage is generated with the switch-off semiconductor switch 13 between the gate 5 and the emitter 9 via the switch-off resistor 17, which switch-off voltage generates a constant gate current, and the charge removal period T3 is defined by the quotient of the removal charge and the constant gate current.

Figure 3:
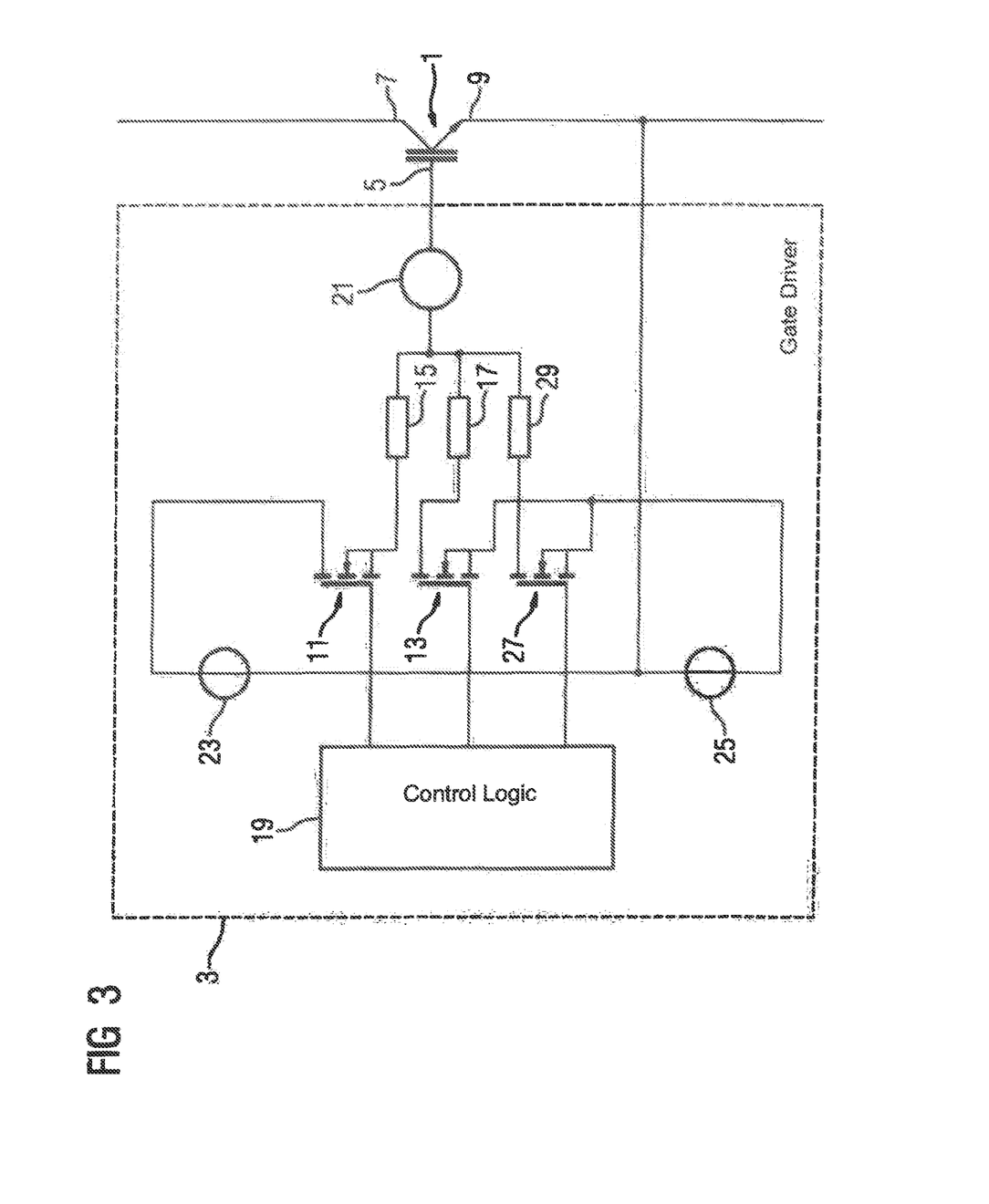

FIG. 3 shows a circuit diagram of an IGBT 1 and a second exemplary embodiment of a gate driver 3 for an IGBT 1. The gate driver 3 distinguishes itself from the exemplary embodiment shown in FIG. 1 only by a series circuit of an additional switch-off semiconductor switch 27 and an additional switch-off resistor 29 connected in parallel with the switch-off semiconductor switch 13 and the switch-off resistor 17. The additional switch-off resistor 29 is greater than the switch-off resistor 17. The additional switch-off semiconductor switch 27 is designed as a normal blocking n-channel MOSFET. The gate terminal of the additional switch-off semiconductor switch 27 is connected to the control logic 19 so that the additional switch-off semiconductor switch 27 can be controlled by the control logic 19, The drain terminal of the additional switch-off semiconductor switch 27 is connected to the gate 5 of the IGBT 1 via the additional switch-off resistor 29. The source terminal of the additional switch-off semiconductor switch 27 is connected to the first pole of the switch-off voltage source 25.

Figure 4:
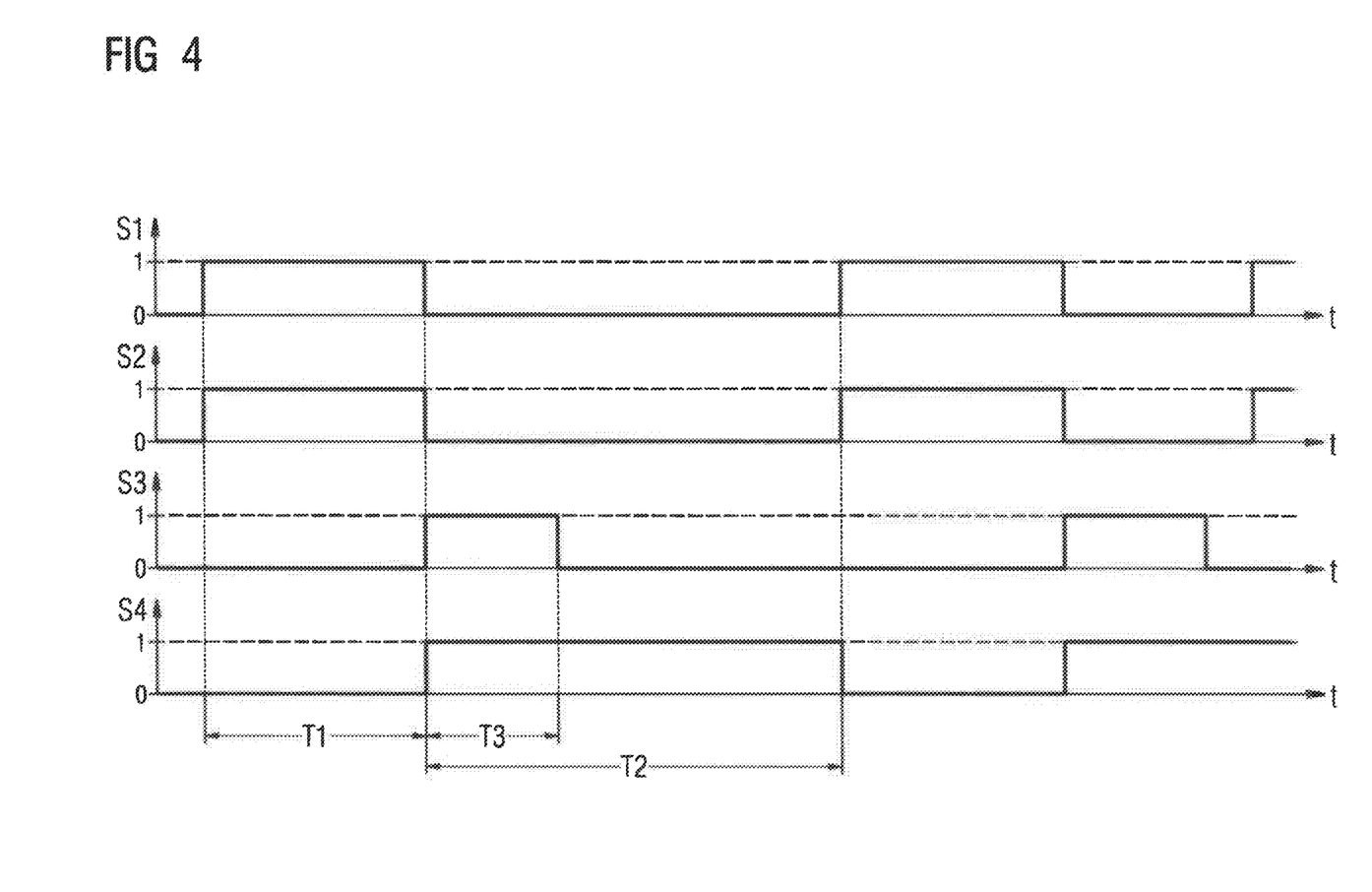

FIG. 4 illustrates the method according to the invention for operating an IGBT 1 with a gate driver 3 shown in FIG. 3 on the basis of chronological sequences of a switching state S1 of the IGBT 1, a switching state S2 of the switch-on semiconductor switch 11, a switching state S3 of the switch-off semiconductor switch 13 and a switching state S4 of the additional switch-off semiconductor switch 27.

In turn, a maximum steady-state reverse voltage required for operation of the IGBT 1, a minimum removal charge, the removal of which at the gate 5 of the IGBT 1 brings about an electric field strength which enables the IGBT 1 to accept the maximum steady-state reverse voltage during steady-state blocking, and a maximum removal charge, the removal of which at the gate 5 brings about an electric field strength which leads to a dynamic avalanche, are determined.

The IGBT 1 is alternately switched on for a switch-on period T1 and switched off for a switch-off period 12. During each switch-on period T1, the switch-on semiconductor switch 11 is switched on and the switch-off semiconductor switch 13 and the additional switch-off semiconductor switch 27 are switched off. During each switch-off period T2, the switch-on semiconductor switch 11 is switched off, the switch-off semiconductor switch 13 is initially switched on for a charge removal period T3 and switched off after the expiry of the charge removal period 13 and the additional switch-off semiconductor switch 27 is switched on. The charge removal period T3 is defined in that a removal charge greater than the minimum removal charge and less than the maximum removal charge is removed from the gate 5 of the IGBT 1 during a switch-off period T2. In contrast to the exemplary embodiment of the method according to the invention described with reference to FIG. 2, in this case charge is taken from the gate 5 by switching on the additional switch-off semiconductor switch 27 for the entire switch-off period T2. If the additional switch-off resistor 29 is sufficiently large, the charge taken from the gate 5 after switching off the switch-off semiconductor switch 13 during the switch-off period 12 is small, however, so that it can either be completely ignored, or the determination of the charge removal period T3 is based on a maximum removal charge reduced by this charge. Switching on the additional switch-off semiconductor switch 27 during a switch-off period 12 can advantageously stabilize the switch-off behavior of the IGBT 1.

Figure 5:
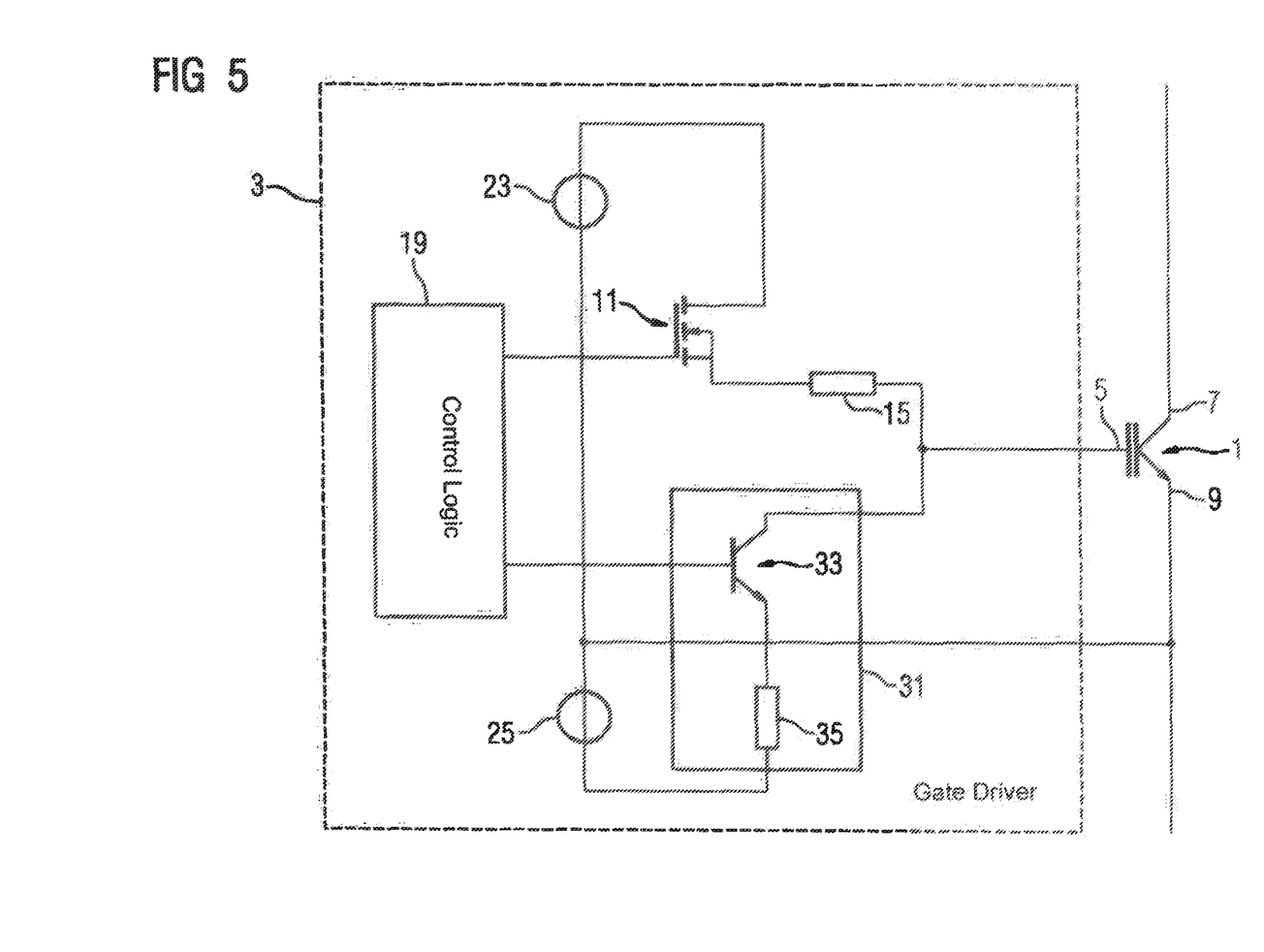
Figure 6:
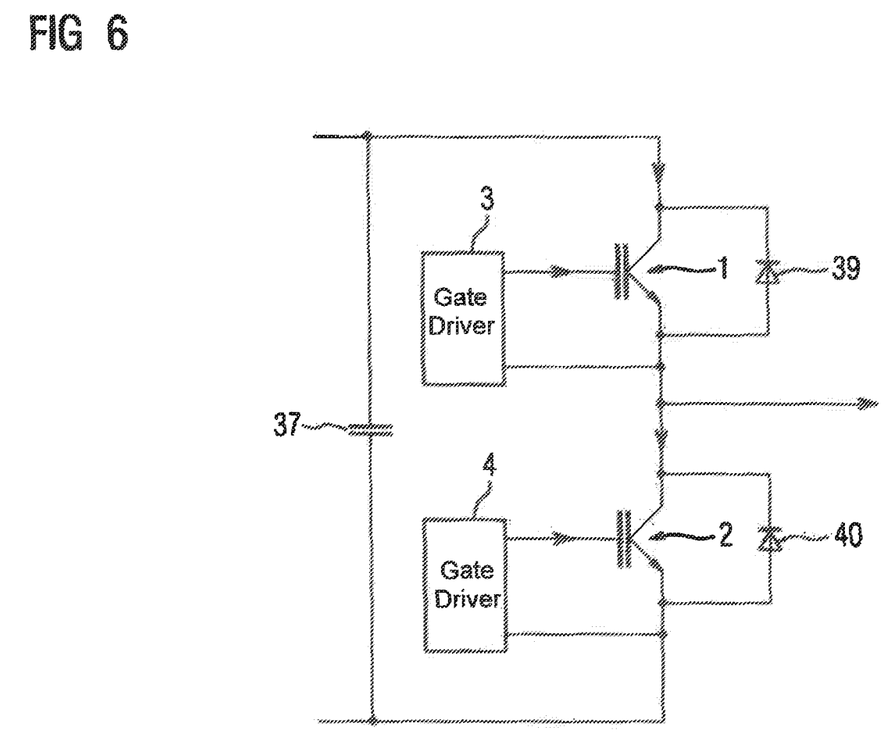

FIG. 5 shows a circuit diagram of an IGBT 1 and a third exemplary embodiment of a gate driver 3 for an IGBT 1. The gate driver 3 differs from the exemplary embodiment shown in FIG. 1 in that it has a switch-off current source 31 for generating a constant gate current instead of the series circuit of the switch-off semiconductor switch 13 and the switch-off resistor 17. Analogous to the switch-off semiconductor switch 13 in the exemplary embodiment of the method according to the invention described with reference to FIG. 2, the switch-off current source 31 is switched off during each switch-off period T2 of the IGBT 1 for a charge removal period 13. The charge removal period T3 is defined by the quotient of the removal charge and the constant gate current. During the switch-on period T1 of the IGBT 1, in which the switch-on semiconductor switch 11 is switched on, and the remaining switch-off period T2, the switch-off current source 31 is switched off. In the exemplary embodiment of a gate driver 3 shown in FIG. 5, the switch-off current source 31 is realized by a series circuit of a bipolar transistor 33 which can be controlled by the control logic 19 and a current source resistor 35. However, other embodiments of a switch-off current source 31 which can be controlled by the control logic 19 are also possible, FIG. 6 shows a circuit diagram of a half-bridge circuit with two IGBT 1, 2, a first gate driver 3 for a first IGBT 1 and a second gate driver 4 for the second IGBT 2. Each IGBT 1, 2 is arranged in a bridge arm of a half bridge. The bridge arms are connected to one another by a capacitor 37. A freewheeling diode 39, 40 is connected in parallel with each IGBT 1, 2, Each gate driver 3, 4 is designed like the gate driver 3 of the exemplary embodiment shown in FIG. 1 or FIG. 5.

Figure 7:
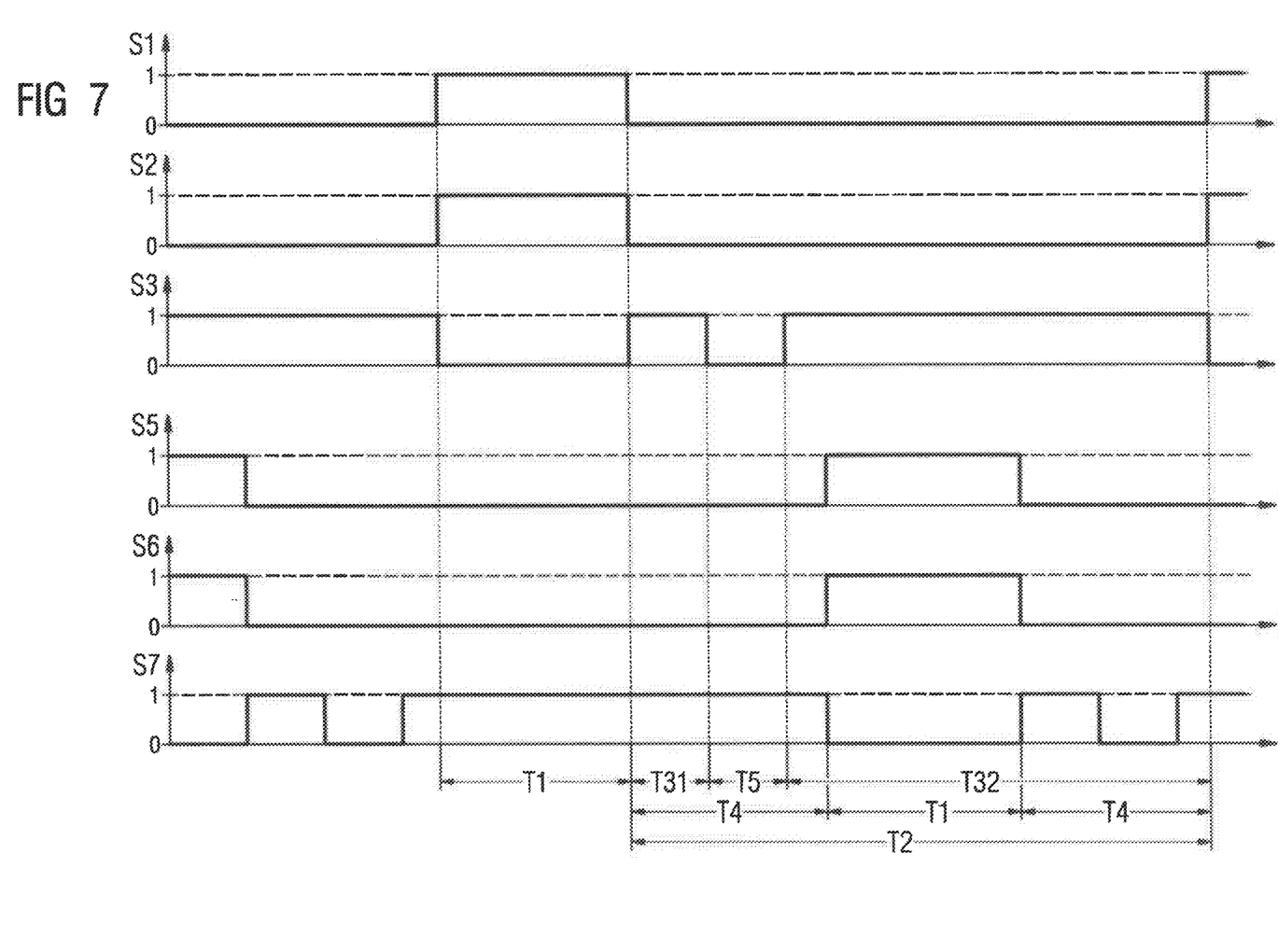

FIG. 7 illustrates the method according to the invention for operating two IGBT 1, 2 connected to form a half bridge according to FIG. 6 on the basis of chronological sequences of a switching state S1 of the first IGBT 1, a switching state S2 of the switch-on semiconductor switch 11 of the first gate driver 3, a switching state S3 of the switch-off semiconductor switch 13 of the first gate driver 3, a switching state S5 of the second IGBT 2, a switching state S6 of the switch-on semiconductor switch 11 of the second gate driver 4 and a switching state S7 of the switch-off semiconductor switch 13 of the second gate driver 4.

For each IGBT 1, 2, a maximum steady-state reverse voltage required for its operation, a minimum removal charge, the removal of which at the gate 5 of the IGBT 1, 2 brings about an electric field strength which enables the IGBT 1 to accept the maximum steady-state reverse voltage during steady-state blocking, and a maximum removal charge, the removal of which at the gate 5 brings about an electric field strength which leads to a dynamic avalanche, is determined.

The two IGBT 1, 2 are switched on alternately for one switch-on period T1 in each case, wherein in each case two consecutive switch-on periods T1 are separated from one another by a locking period T4, in which both IGBT 1, 2 are switched off.

During each switch-off period T2 of each IGBT 1, 2, a removal charge is taken from the gate 5 of the IGBT 1, 2 during a charge removal period T3 analogously to the method described with reference to FIG. 2, which removal charge is greater than the minimum removal charge determined for it and smaller than the maximum removal charge determined for it. The charge removal period T3 is, however, divided into two charge removal periods T31, T32 separated from one another by a removal pause T5, wherein a first charge removal period T31 begins with the switching off of the IGBT 1, 2 and ends before the other IGBT 2, 1 is switched off and the second charge removal period T32 begins after the end of the first charge removal period T31 and before the other IGBT 2, 1 is switched on and ends when the IGBT 1, 2 are switched on.

The method described with reference to FIG. 7 can be modified analogously to the method described with reference to FIG. 4 if the gate drivers 3, 4 are each designed like the gate driver 3 shown in FIG. 3.

Although the invention was illustrated and described in more detail by preferred exemplary embodiments, the invention is not limited by the disclosed examples and other variations may be derived therefrom by a person skilled in the art without departing from the scope of the invention.

The invention claimed is:

1. A method for operating an IGBT, comprising:
   determining a maximum steady-state reverse voltage required for operating the IGBT;
   determining a first removal charge, which when removed at a gate of the IGBT produces a first electric field strength that enables the IGBT to receive during steady-state blocking the maximum steady-state reverse voltage;
   determining a second removal charge, which when removed at the gate of the IGBT produces a second electric field strength that causes a dynamic avalanche;
   when the IGBT is switched off, applying during a charge removal period a switch-off voltage between the gate and an emitter of the IGBT, and removing during the charge removal period from the gate a third removal charge that is greater than the first removal charge and smaller than the second removal charge; and
   measuring, while the switch-off voltage is applied, a gate current flowing in the gate, determining from the measured gate current a fourth charge removed from the gate, and determining an end of the charge removal period when the fourth charge reaches the third removal charge.

2. The method of claim 1, wherein the fourth charge is removed from the gate by generating a constant gate current flowing in the gate during the charge removal period.

3. The method of claim 1, further comprising:
   predetermining a threshold value for a gate-emitter voltage of the IGBT, and
   terminating removal of fourth charge from the gate when the gate-emitter voltage reaches the threshold value.

4. A method for operating two IGBTs connected in form of a half bridge, said method comprising, for each respective of the two IGBTs:
   determining a maximum steady-state reverse voltage required for operating the respective IGBT;

determining a first removal charge, which when removed at a gate of the respective IGBT produces a first electric field strength that enables the respective IGBT to receive during steady-state blocking a maximum steady-state reverse voltage;

determining a second removal charge, which when removed at the gate of the respective IGBT produces a second electric field strength that causes a dynamic avalanche;

when the respective IGBT is switched off, applying during a charge removal period a switch-off voltage between the gate and an emitter of the respective IGBT, and removing during the charge removal period from the gate a third removal charge that is greater than the first removal charge and smaller than the second removal charge;

measuring, while the switch-off voltage is applied, a gate current flowing in the gate, determining from the measured gate current a fourth charge removed from the gate, and determining an end of the charge removal period when the fourth charge reaches the third removal charge;

alternately switching the two IGBTs on for a respective switch-on period, wherein two consecutive switch-on periods are separated from one another by a locking period; and dividing the charge removal period for each IGBT into two charge removal periods separated from one another by a removal pause, wherein a first of the two charge removal periods begins when one of the two IGBTs is switched off and ends before the other of the two IGBTs is switched on, and a second of the two charge removal periods begins after the first charge removal period ends and before the other of the two IGBTs is switched on and ends when the one IGBT is switched on.

5. The method of claim 4, wherein the charge removal period for each IGBT is between one hundred nanoseconds and ten microseconds.

6. A gate driver for an IGBT, comprising:
a controllable switch-off semiconductor switch constructed to apply a switch-off voltage between a gate and an emitter of the IGBT,
a switch-off resistor connected between the switch-off semiconductor switch and the gate or connected downstream of a gate-emitter path of the IGBT,
a current measuring apparatus for measuring a gate current flowing in the gate, and
a control logic configured to
determine a maximum steady-state reverse voltage required for operating the IGBT,
determine a first removal charge, which when removed at a gate of the IGBT produces a first electric field strength that enables the IGBT to receive during steady-state blocking the maximum steady-state reverse voltage,
determine a second removal charge, which when removed at the gate of the IGBT produces a second electric field strength that causes a dynamic avalanche,
when the IGBT is switched off, apply during the charge removal period a switch-off voltage between the gate and an emitter of the IGBT, and remove during the charge removal period from the gate a third removal charge that is greater than the first removal charge and smaller than the second removal charge,
measure, while the switch-off voltage is applied, a gate current flowing in the gate, determine from the measured gate current a fourth charge removed from the gate, and determine an end of the charge removal period when the fourth charge reaches the third removal charge,
alternately switch on the IGBT for a switch-on period and to switch off the IGBT for a switch-off period and to remove the removal charge from the gate of the IGBT in each switch-off period.

7. The gate driver of claim 6, further comprising a series circuit of an additional switch-off semiconductor switch, which is connected in parallel with the switch-off semiconductor switch and with the switch-off resistor, and an additional switch-off resistor, wherein the additional switch-off resistor has a greater resistance value than the switch-off resistor, and the additional switch-off semiconductor switch can be switched on between the gate and the emitter for applying an additional switch-off voltage.

8. The gate driver of claim 6, comprising a controllable switch-off current source with which a constant gate current in the gate can be generated, wherein the control logic is configured to switch on the switch-off current source for the charge removal period.

* * * * *